(12) United States Patent
Koduri

(10) Patent No.: US 6,789,240 B2
(45) Date of Patent: Sep. 7, 2004

(54) METHOD OF CONTROLLING BOND PROCESS QUALITY BY MEASURING WIRE BOND FEATURES

(75) Inventor: Sreenivasan K. Koduri, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 126 days.

(21) Appl. No.: 10/335,837

(22) Filed: Jan. 2, 2003

(65) Prior Publication Data

US 2003/0098707 A1 May 29, 2003

Related U.S. Application Data

(62) Division of application No. 09/921,811, filed on Aug. 3, 2001, now Pat. No. 6,555,401.
(60) Provisional application No. 60/230,396, filed on Sep. 6, 2000.

(51) Int. Cl.$^7$ ................................................. G06F 7/48
(52) U.S. Cl. .......................... 716/4; 382/141; 382/145; 382/146; 382/152
(58) Field of Search ...................... 716/4; 382/145–147, 382/141, 152

(56) References Cited

U.S. PATENT DOCUMENTS

| | | | |
|---|---|---|---|
| 5,119,436 A | * | 6/1992 | Holdgrafer .................. 382/146 |
| 5,640,199 A | * | 6/1997 | Garakani et al. ............. 348/87 |
| 5,955,877 A | | 9/1999 | Farnworth et al. |
| 6,150,828 A | | 11/2000 | Farnworth et al. |
| 6,249,598 B1 | * | 6/2001 | Honda et al. ................ 382/150 |

* cited by examiner

Primary Examiner—Stacy A. Whitmore
(74) Attorney, Agent, or Firm—Wade James Brady, III; Frederick J. Telecky, Jr.

(57) ABSTRACT

A computerized system and method for inspecting and measuring a ball-shaped wire bond formed by an automated bonder pre-programmed to attach a connecting bond onto a bond pad of an integrated circuit by first obtaining a first image of said bond pad before bond attachment, then determining the coordinates of the center of said pad. Second, the bonder is instructed to attach a ball-shaped wire bond to the center of said pad. Next, a second image of said bond pad is obtained after bond attachment; this second image comprises an image of the ball-shaped portion of the bond and an image of the wire portion of said bond. The coordinates of the center of the ball-shaped portion of the bond are obtained by computer processing of the first and second images. The coordinates of the bond center and the pad center are compared, creating information for quality control of the bonder instruction and the bonding process. Finally, the bond process quality is controlled by inputting new bonder instruction for correcting any identified differences between the center coordinates.

5 Claims, 3 Drawing Sheets

METHOD OF CONTROLLING BOND PROCESS QUALITY BY MEASURING WIRE BOND FEATURES

This Is a divisional application of Ser. No. 09/921,811 filed Aug. 3, 2001, now U.S. Pat. No. 6,555,401, which is a non-provisional application claiming priority from provisional application Serial No. 60/2301396 filed Sep. 6, 2000.

FIELD OF THE INVENTION

The present invention is related in general to the field of semiconductor devices and electronic systems and more specifically to an automated system for accurate ball feature measurements in computer-controlled bonding machines used in integrated circuit assembly.

DESCRIPTION OF THE RELATED ART

In integrated circuit (IC) assembly, an IC chip is typically mounted on a leadframe and electrically connected to it by metallic segments. Commonly, the chip assembly, is encapsulated in a protective package (for instance, ceramic package, or plastic package using molding process) Typically, the IC chip has a plurality of bond pads, which are often positioned around the chip perimeter; these bond pads have predetermined bonding area and spacing (bond pad pitch). The leadframe usually has a plurality of narrow "inner" leads for attachment to the segments and inclusion in the package, and a plurality of wider "outer" leads for attachment to other parts such as solder attachment to circuit boards.

The metallic segments used for electrical connection of the IC chip to the leadframe include wires and ribbons, and are attached by ball bonding, stitch bonding, or wedge bonding techniques. Wire bonding is a process in which a wire may be welded from a chip bond pad to the tip of an inner lead of the leadframe. As an example, in wire ball bonding the ball is attached to the chip bond pad and the stitch to the leadframe inner lead. For a given device type, there is a set of locations expressed in x and y coordinates which defines the bond locations on the chip and on the lead tips. These locations are generally stored collectively in a computer file, sometimes referred to as "Device Program". Apart from the bond head, capable of providing x–y–z motion needed for bonding, a wire bonder has a material handling subsystem and the vision subsystem.

Conventional semiconductor computerized wire bonders use x–y tables to move the bonding capillary over the device for bonding between the chip and the leadframe. The x–y coordinate tables are driven by complex electrical and mechanical components that may convert rotary and linear motions of the axis drive motors to create the needed positioning. The bond head also carries several other components such as the z-axis drive motor, a camera and optics for vision functions, and further components required to control wire bonding. Specific features of the capillary and its alignment are described in a number of U.S. patents and patent applications. Examples are: U.S. Pat. No. 5,934,543, issued on Aug. 10, 1999 (Koduri et al., "Wire Bonding Capillary having Alignment Features"); and application Ser. No. 08/993,638, filed on Dec. 18, 1997 (Koduri, "Wire Bonding with Capillary Realignment"). The interaction of capillary and vision system is illustrated, for example, by U.S. patent application Ser. No. 09/191,812, filed on Nov. 13, 1998 (Koduri et al., "Automation of Optics Offset Measurement on Wire Bonders"); Ser. No. 09/111,642, filed on Jul. 8, 1998 (Koduri et al., "An Efficient Hybrid Illuminator"); Ser. No. 09/111,977, filed on Jul. 8, 1998 (Koduri et al., "An Efficient Illumination System for Wire Bonders").

When a unit is indexed in by the material handling system for bonding, the position of the leadframe and the chip is not always the same because of variations in the handling and previous manufacturing (such as variable chip positioning during attachment to the leadframe). Without knowing accurately the target bonding locations, the bond head cannot place the bonds as expected. To aid this process, a machine vision system is employed. A typical vision system consists of a set of optics to provide the needed illumination and magnification of the device, a camera to capture the image provided by the optics and an image processing system to store and analyze the captured image.

Before bonding a device, it is essential to determine the device program with all the coordinate locations of the bonds that need to be created. With respect to a predetermined set of reference locations, those locations are often referred to as "homes". A typical device may have one or more "homes". Generally, the identification of homes needs to be done individually for each device to be bonded. It is common practice to use a three-step process to enable such identification.

In the step of "teaching", the coordinate locations of the homes and all the needed bonds are identified and saved to create the "device program". Once generated, a device program can be stored, copied and/or shared between multiple machines as needed.

In the step of "regeneration" or "retrieving", a human operator helps in locating the homes of the first device after loading in the information from the previously saved device program. At this point, the machine captures and saves a set of images, called "reference images" or "references" in the neighborhood of each home.

In the step of "bonding", the machine indexes one unit or more at a time into the workstation under the bond head. At this point, the vision system, with the aid of a pattern recognition system, attempts to relocate the matching locations with the saved references. After finding the new coordinates of the matching references, the home and bond locations are re-computed for that specific unit from the device program data. The process of relocating the references and homes is normally referred to as "aligning" the device. Using the specific bond locations, the device can now be bonded. The process of indexing, aligning and bonding is repeated without any human intervention as long as nothing abnormal happens on the machine.

Problems in wire bonding techniques arise in part from the technology trends to increase the number of leads in a given package and to make IC chip packages smaller. As consequences, the bonding pads located on the chip receive smaller areas and are spaced closer together, and the inner leads of leadframes are made narrower and closer together. These trends demand tighter control of wire bond ball and stitch geometries and placements. For instance, even small bond placement errors may result in device loss.

For the bond machines, errors in x–y tables and motors need to be reduced. At the microscopic level, the shape of free air balls and the precision of forming nail-head "ball"-attachments need to be controlled such that uniform reproducibility can be guaranteed. These controls for forming and attaching wire "balls" determine to a great extent the quality of the bonding process.

The emerging technical problems for automated bond machines can be summarized as follows:

Accuracy: Small ball/fine pitch bonding requires a very accurate system to be able to place the ball completely on the bond pad. The current systems have difficulties in achieving this.

Large variations in illumination settings can lead to variations of the images as seen by the optics and the camera.

The current systems cannot handle x–y table inconsistencies. For small pad/fine pitch bonding, a small error in ball placement can cause the ball to be partially off the pad.

Human error during regeneration of alignment program: Ball placement is greatly affected by the accuracy of the alignment program. There are many steps to this regeneration process end thus there are many chances for human error.

Time spent performing alignment regeneration: Whenever a device is to be bonded, a human operator typically has to spend a finite amount of time to perform an alignment regeneration.

U.S. Patent Application No. 60/201,910, filed on May 4, 2000 (Koduri et al., "System and Method to Reduce Bond Program Errors of Integrated Circuit Bonders"), No. 60/204, 997, filed on May 16, 2000 (Bon et al., "System and Method to Customize Bond Programs Compensating Integrated Circuit Bonder Variability"), and No. 60/206,493, filed on May, 23, 2000 (Koduri et al., "System and Method to Recreate Illumination Conditions on Integrated Circuit Bonders") describe methods how a network of relationships between reference images, bond locations, and illumination conditions can be used to adaptively compensate for variable characteristics of a slave circuit compared to a master circuit, and a slave bonder compared to a master bonder. The present invention is related to these patent applications.

Unfortunately, however, they do not address methods how an individual bonder can correct gradual and systematic errors, or random and unpredictable errors in the bond pads or the bonding operation. In U.S. Patent Application No. 60/222,529, filed on Aug. 2, 2000, (Koduri, "Method to Self-Correcting Bond Placement Errors of Integrated Circuit Bonders"), the error between the intended bonding location and the actual location is determined by computing distances and directions between the pre-programmed and actual pad centers and the actual bond location. The present invention is related to this patent application. However, no method is described to compensate for variations of "ball" bond features—a key ingredient of bond quality control. U.S. Pat. No. 5,991,436, issued on Nov. 23, 1999 (Koljonen et al., "Apparatus and Method for Inspecting Wire Bonds on Leads"), concerns itself only with the control of wire stitch bonds on metallic leadframes.

An urgent need has therefore arisen for a fast, reliable and flexible system and method to inspect, measure and correct "ball"-shaped wire bonds for controlling bond process quality. The system and method should be flexible enough to be applied for different IC product families with a wide spectrum of design variations, and for different bond machines. The system and method should spearhead solutions toward the goals of improved product yield and reliability, preferably without investment in new equipment.

SUMMARY OF THE INVENTION

The present invention provides a computerized system and method for inspecting and measuring a ball-shaped wire bond formed by an automated bonder pre-programmed to attach a connecting bond onto a bond pad of an integrated circuit by first obtaining a first image of said bond pad before bond attachment, then determining the coordinates of the center of said pad. Second, the bonder is instructed to attach a ball-shaped wire bond to the center of said pad. Next, a second image of said bond pad is obtained after bond attachment; this second image comprises an image of the ball-shaped portion of the bond and an image of the wire portion of said bond. The coordinates of the center of the ball-shaped portion of the bond are obtained by computer processing of the first and second images. The coordinates of the bond center and the pad center are compared, creating information for quality control of the bonder instruction and the bonding process. Finally, the bond process quality is controlled by inputting new bonder instruction for correcting any identified differences between the center coordinates.

The present invention is related to high density ICs, especially those having high numbers of input/outputs and tight constraints in package outline and profile. These ICs can be found in many semiconductor device families such as processors, standard linear and logic products, digital and analog devices, high frequency and high power devices, and both large and small area chip categories. Since the invention aims at designing devices with minimum geometries and high reliability, it supports continually shrinking applications such as cellular communications, pagers, hard disk drives, laptop computers and medical instrumentation.

It is an aspect of the present invention to provide an automated system and method for inspecting and measuring wire bond features needed for controlling bond process quality. It is another aspect of the present invention to provide a highly flexible system and method, applicable not only to semiconductor wire bonders, but also to many automated machines pre-programmed to perform mechanical action onto action sites of objects. These aspects are achieved by the embodiments of an "image comparator" subsystem of the invention:

Two images obtained by a vision system are processed in an automated method by first extracting the image of the mechanical result of the action, in the example of wire bonding the attached bond itself. The extracted image is then filtered by removing noise, and the filtered image is reduced to contours only, outlining the geometrical shape of the bond portion having the ball-shaped bond. The geometrical outlines are further reduced to thin, narrowly defined contours. The contours of the ball-shaped bond portion are then approximated by a simplified search model selected for best fit into the contour outline, and he coordinates of the center of the search model are determined. Examples of search models include circles, ellipses, polygons, and synthetic images.

Another aspect of the invention is to achieve the improved quality control by automatically computing a new bond center coincident with the pad center and implementing the new center into the bonder as the corrected bond attachment instruction.

Another aspect of the present invention is to introduce methods of quality control which are flexible so that they can be applied to many families of electronic structures—reaching from semiconductor chips to piece parts, such as leadframes and interconnectors, to device packages, to electronic substrates, and to whole assemblies on motherboards—and are general so that they can be applied to several generations of products.

Beyond the electronics realm, the computerized system and method of this invention can be generally applied to control quality by inspecting mechanical features produced by machines prepared to mechanically work on action sites of objects. The automated system for accurate placement continuously inspects and measures shapes, of connections, and corrects any deviation in the placement process, which requires high precision on equipment. Besides wire bonding, examples are local actions such as hole drilling, nail attaching, and mechanical bridging. A machine vision system in conjunction with a robotic placement mechanism mimics the human hand-eye coordination. The stringent requirements placed on the components can than be relaxed as any deviation in performance is going to be automatically corrected for.

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

This invention is related to U.S. Patent Application No. 60/222,529, filed on Aug. 2, 2000 (Koduri, "Method of Self-Correcting Bond Placement Errors of Semiconductor Circuit Bonders").

Figure 1:
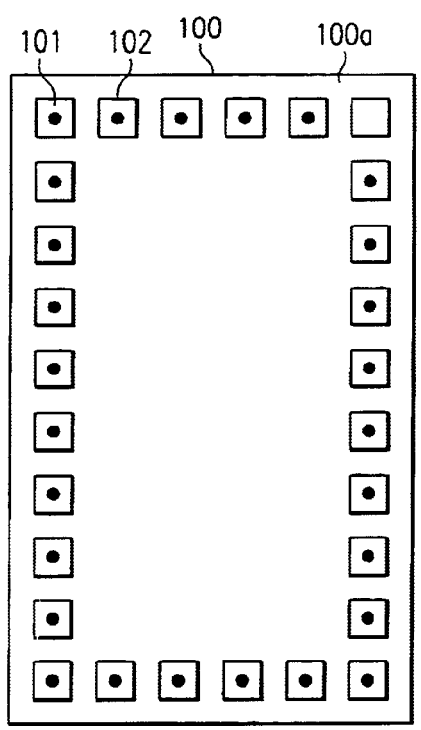
FIG. 1 is a schematic and simplified top view of an integrated circuit (IC) chip illustrating bond pads with correctly placed bond attachments.
Figure 2:
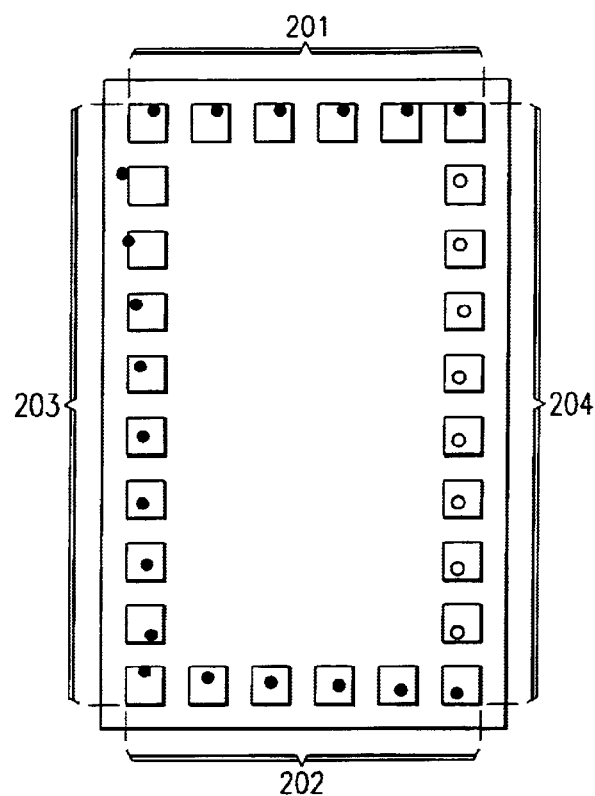
FIG. 2 is a schematic and simplified top view of an IC chip illustrating bond pads with erroneously placed bond attachments.

FIGS. 1 and 2 illustrate examples of the problems in integrated circuit (IC) chip assembly and the errors in bonding operation addressed by the present invention. In FIG. 1, a plurality of bond pads 101 is provided on the active surface 100a of chip 100. In the ideal assembly case illustrated, all bonds 102 attached to pads 101 are located in the center of the pad areas. In FIG. 2, a similar plurality of bond pads is shown, but the bonds are located off the ideal locations in several ways. In the top row 201 of pads, all bonds are offset and shifted towards the pad perimeter (where probably all of them will represent a risk to the quality of the bonds and to the reliability of the material surrounding the pad area). In the bottom row 202 of pads, the bonds are gradually slanted (so that several of them fall outside of the range of acceptable bond). In the left hand row 203 of pads, the bonds are also gradually slanted (so much so that some bonds miss their pads altogether). In the right hand row 204 of pads, the bond are spread out and misplaced without a general trend (possibly caused by non-linearities in the axis of the row or by gradual thermal expansion of the chip).

It should be pointed out that errors as depicted in FIG. 2 may be developing gradually over time and may be systematic. On the other hand, other errors emerge at random and unpredictably. Numerous causes contribute to this undesirable behavior. The capillary as the bonding tool is typically made of ceramic or ruby materials; however, its holding and moving fixture, is made of metal. Further, the motors, tables, and optics are made different materials. In addition to material and mechanical differences, there are harsh thermal and ultrasonic effects, because the bonding operations are performed at elevated temperatures, and during bonding, mechanical pressure and ultrasonic energy are applied. Consequently, it is almost unavoidable that initial set-up conditions change after few operations. Corrective efforts by stabilizing components or environment have typically been found to be very expensive, or even impossible.

Any of the errors depicted in FIG. 2 can severely limit the ability of bonding machines ("bonders" and thus the ability of producing smaller, faster ands lower cost devices economically. The solutions to these errors of known technology include building and testing the x–y tables for higher perfection—which is prohibitively expensive and often not acceptable to the existing fleet of machines. Other corrective efforts by stabilizing components or environment have typically been found to be very expensive, or even impossible.

In contrast, the present invention does not assume that the electro-mechanical components behave consistently in a predictable manner even for a short duration of time. Rather, the invention accepts that the operating components have a random error associated with them that cannot be pre-determined.

The invention concerns itself specifically with errors of the ball-shaped portion of a wire bond attached to an IC chip bond pad, symbolized by the circular black dots in FIGS. 1 and 2. As defined herein, the term "ball-shaped" does not imply that the wire "balls" are necessarily spherical. They ma, have various forms, such as nail-head, elliptical, semispherical, half-dome, or truncated cone. The exact shape is a function of the geometry of the capillary opening and the attachment technique (pressure, temperature, etc.).

The wire material usually consists of gold (with optional very small contents of beryllium, copper, palladium, iron, silver, calcium or magnesium), copper, or aluminum. The wire bonding process begins by positioning the semiconductor chip on a heated pedestal to raise the temperature to between 150 and 300° C. The wire is strung through a capillary. At the tip of the wire, a free air ball is created using either a flame or a spark technique. The ball has a typical diameter from about 1.2 to 1.6 wire diameters. The capillary is moved towards the chip bonding pad (101 in FIG. 1) and the ball is pressed against the metallization of the pad. For pads of aluminum, a combination of compression force and ultrasonic energy create the formation of gold-aluminum intermetallics and thus a strong metallurgical bond. The compression (also called Z- or mash) force is typically between about 17 and 75 g; the ultrasonic time between about 10 and 20 ms; the ultrasonic power between about 20 and 50 mW. At time of bonding, the temperature usually ranges from 150 to 270° C. In the case of copper wire on copper pad, only metal interdiffusion takes place in order to generate the strong weld.

Alternatively, both wire ends can be wedge bonded to the same bonding pad.

Figure 3A:
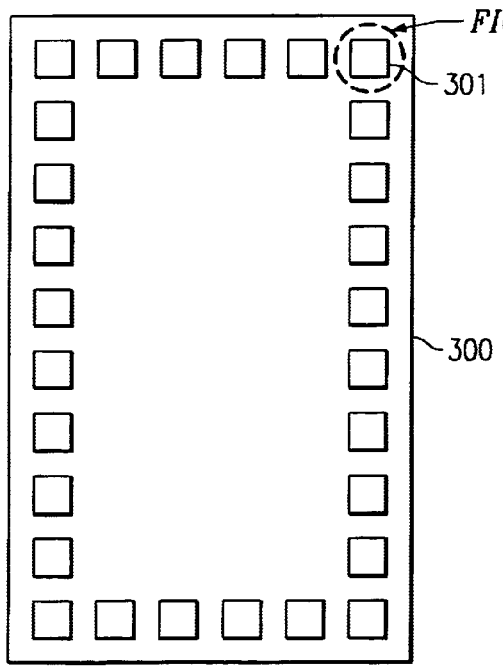
FIG. 3A is schematic and simplified top view of an IC chic illustrating bond pads, with one pad marked for the image in FIG. 3B, taken by the vision system.
Figure 3B:
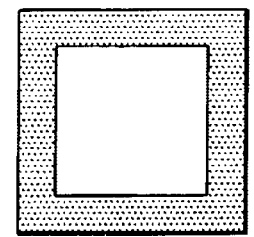
FIG. 3B illustrates the image of a bond pad before bond attachment, the first image obtained according to the invention.
Figure 3C:
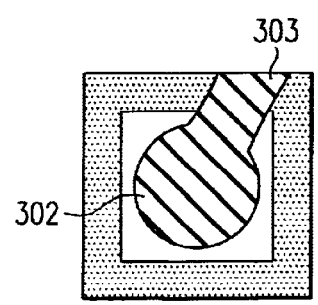
FIG. 3C illustrates the image of the same bond pad as in FIG. 3B after bond attachment, the second image obtained according to the invention.
Figure 6A:
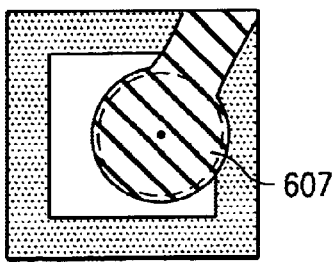
FIGS. 6A and 6B illustrate images before and after correcting the placement of wire ball bonds.
Figure 6B:
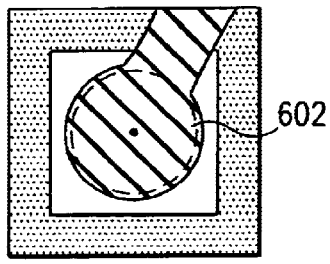

FIG. 3A is a schematic and simplified top view of an IC chip 300 with empty bond pads 301. FIG. 3B shows an image of bond pad 301, as obtained by the vision system associated with the bonder, before bond attachment. FIG. 3C shows an image of bond pad 301 after bond attachment; the ball-shaped portion of the bond is designated 302, and the wire portion is designated 303. In order to highlight the conceptual breadth of the present invention, as summarized in FIGS. 3B, 3C, 4A–4E, and 5, it should be pointed out that the contributing innovations come from the following process steps:

Obtaining a first image of a selected bond pad before bond attachment (see FIG. 3B) by using the computer-controlled vision system associated with the bonder;

determining the coordinates of the center of this bond pad; p1 instructing the computerized, automated bonder to attach a ball-shaped wire bond to the center of the pad;

obtaining a second image of the bond pad after bond attachment (see FIG. 3C). This second image comprises an image of the ball-shaped portion 302 of the bond and an image of the wire portion 303 of the bond;

determining the coordinates of the center of the ball-shaped portion 302 of the bond by computer processing of first image and second images. This step of computer processing is detailed in FIGS. 4A through 4E and described below;

comparing the coordinates of the bond center and the pad center, thereby creating information for quality control of the bonder instruction and bonding process; and controlling the bond process quality by inputting new bonder instruction for correcting any identified differences between the center coordinates. As a consequence, the ball bond placement as illustrated in FIG. 6A is corrected to the placement as illustrated in FIG. 6B, thus controlling the wire bond process quality.

It is important for the present invention to consider in detail the method steps for the computer processing of the first and second images, as exemplified in FIGS. 3B and 3C. These processing steps involve computer software methods as described, for example, in the following literature textbooks:

1) R. M. Haralick and L. G. Shapiro, "Computer and Robot Vision", Wiley, New York, 1992.
2) A. K. Jain, "Fundamentals of Digital Image Processing", Prentice Hall, New Jersey, 1989.
3) R. C. Gonzalez and P. Wintz, "Digital Image Processing", Addision-Wesley Publishing Co., Massachusetts, 1987.

Figure 4A:
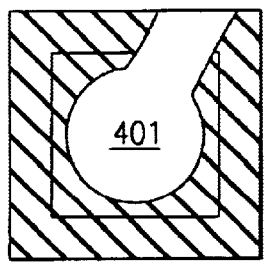
FIG. 4A illustrates the image of the first step ("image extracting") of the computer processing of the images shown in FIGS. 3B and 3C.
Figure 4B:
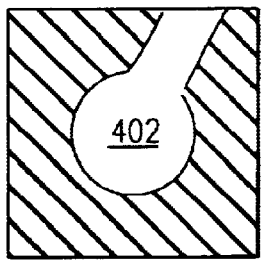
FIG. 4B illustrates the image of the second step ("noise filtering") of the computer processing of the images shown in FIGS. 3B and 3C.
Figure 4C:
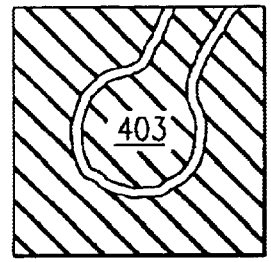
FIG. 4C illustrates the image of the third step ("contour generating") of the computer processing of the images shown in FIGS. 3B and 3C.
Figure 4D:
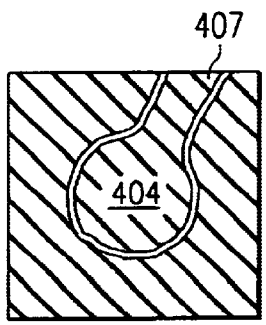
FIG. 4D illustrates the image of the fourth step ("contour refining") of the computer processing of the images shown in FIGS. 3B and 3C.
Figure 4E:
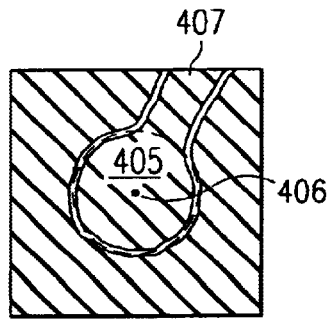
FIG. 4E illustrates the image of the fifth step ("contour approximating") of the computer processing of the images shown in FIGS. 3B and 3C.
Figure 5:
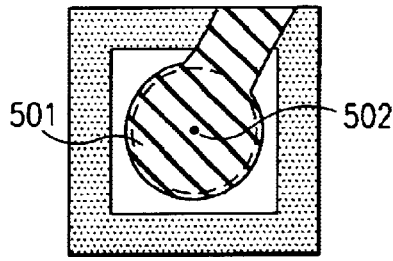
FIG. 5 illustrates the image of the result of combining the image shown in FIG. 3B with the image shown in FIG. 4E.

In sequence, these computer processing steps comprise the following steps, which are illustrated, by way of example, in FIGS. 4A through 4E and result in FIG. 5:

Extracting the image or the attached bond. This step comprises the subtraction of FIG. 3B from FIG. 3C and results in FIG. 4A (consequently, FIG. 4A appears as the "photographic negative" of image FIG. 3C with the ball-shaped bond 401 in light color);

filtering said extracted bond image by removing noise. This filtering step may be accomplished, for instance, by the software program called "Erode" (see literature quoted above). The ball-shaped bond 402 in FIG. 4B has crisper defined outlines than the image in FIG. 4A;

reducing the filtered bond image to contours only, thus outlining the geometrical shape of the bond portion by the white contour 403 in FIG. 4C, highlighting the ball-shaped bond. This reducing step may be accomplished, for instance, by the software program called "Sobel" (see literature quoted above);

refining the geometrical outlines 403 into thin, narrowly defined contours 404 in FIG. 4D. This refining step may be accomplished, for instance, by the software program called "Skeleton" (see literature quoted above);

approximating the contours of said ball-shaped bond portion by a simplified search model selected for best fit into said ball-shaped outline. In FIG. 4E, this search model is a circle 405. Other search models for best fit include ellipse, polygon, or synthetic image; and determining the coordinates of the center of said search model. This determining step may be accomplished, for instance, by the software program called "Hough" (see literature quoted above); it identifies the center as equidistant from the outline of the search model. For the circle 405 in FIG. 4E, the center is designated 406.

It should be noted that the search model of the complete bond may further include a portion approximating the contours of the wire portion 407 in FIG. 4D. Generally, at least a portion of a polygonal approximation will be suitable as that search model (it is not shown in FIG. 4E). Specifically, at least a portion of a rectangle may suffice as the search model of the wire portion of the bond image. Furthermore, this wire-modeling portion may be continuous with the simplified search model of the ball-shaped portion; it may also have substantially the same width as the width of the bonding wire.

As the result of the computer processing steps illustrated in FIGS. 4A to 4E, the center of the ball-shaped wire bond has now been determined. This result is illustrated in FIG. 5 by overlaying the search model (circle) 501 and its center 502 over the image shown in FIG. 3C. With the coordinates of the bond center 502 determined, the desired bond process quality control can be implemented. The coordinates of bond center 502 are compared with the coordinates of the pad center (see description of FIG. 3B); if the two centers are not coincident, a new bond center will be computed such that it will be coincident with the pad center. This new bond center will be implemented into the bonder as the corrected bond attachment instruction, resulting in a centered new bond.

The success of this method for controlling bond process quality illustrated in FIGS. 6A and 6B. FIG. 6A shows an image of the bond before the automatic bond placement correction described in FIGS. 4A to 4E; the ball-shaped portion 601 is off center relative to the pad center. FIG. 6B shows the bond after the automatic placement correction; the ball-shaped portion 602 is well centered relative to the pad center.

Figure 7:
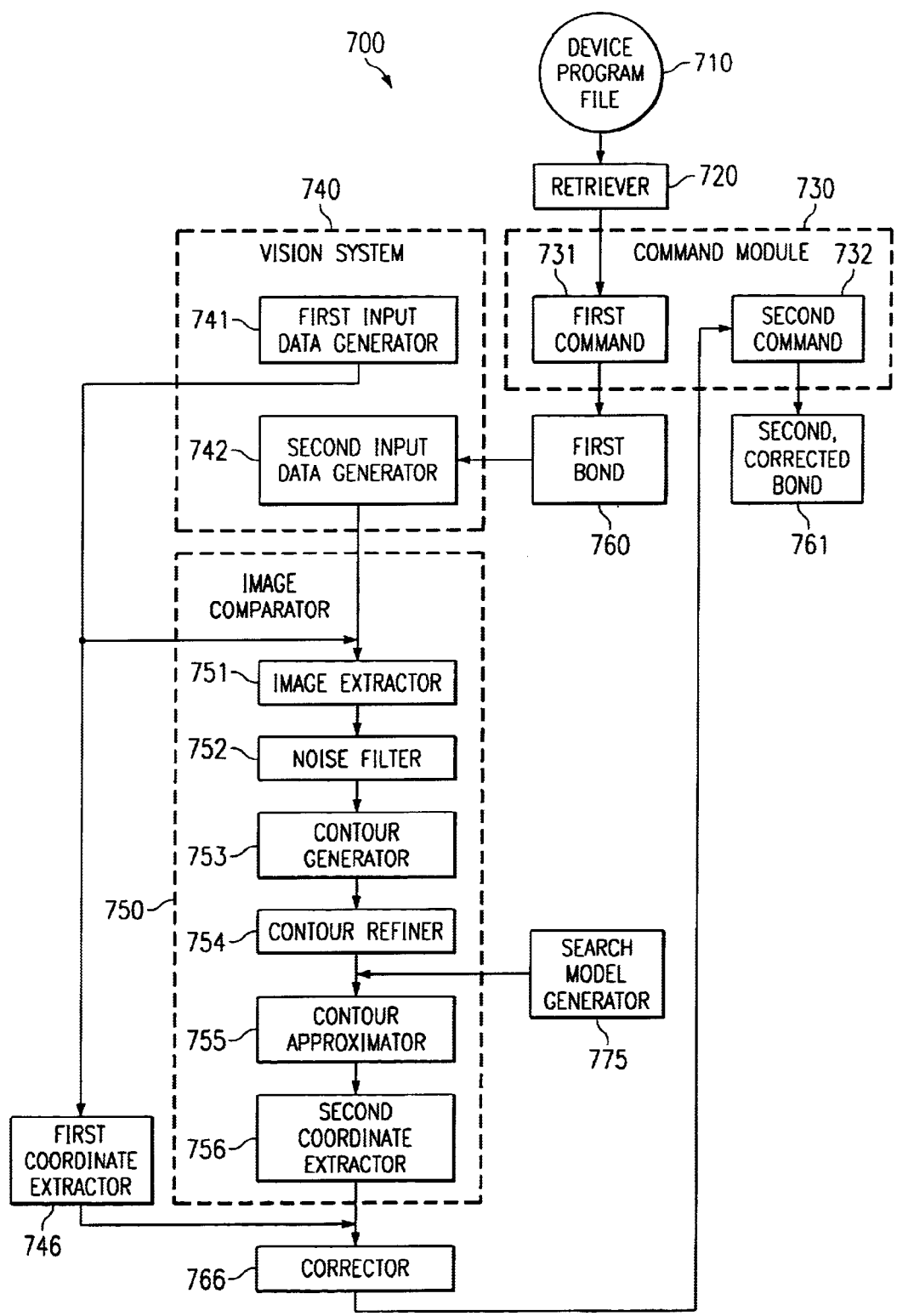
FIG. 7 illustrates a block diagram of a computer system for inspecting, measuring, and correcting bond placement errors of a semiconductor chip assembly bonder according to the invention.

FIG. 7 illustrates a simplified block diagram of the computer system as disclosed by this invention for identifying and correcting bond placement errors of a semiconductor chip assembly bonder and thus controlling the bond process quality. In FIG. 7, the computerized system of the present invention, generally designated 700, operates to provide data generation as well as data analysis for creating corrected bonding instructions for the bonding process of an IC. The bonder is pre-programmed to attach connecting bonds onto bond pads of an integrated circuit, and the bonder has a vision system associated with it. The pre-generated device program file 710 operates to store the master bond program used for the pre-programming.

Device program file 710 is connected to a retriever 720. The retriever regenerates the master program and relates that program to coordinate references. The retriever 720 is coupled to the command module 730 of the computerized bonder, specifically to the first command module 731 within command module 730.

The vision system 740, consisting of optics and a camera and associated with the bonder, provides the first input data generator 741. The input generator collects a first image from a sacrificial, still empty bond pad before bond attachment. Based on these input data, the coordinates of the center of the empty bond pad will automatically be determined by the first coordinate extractor 746 and forwarded to the corrector 766. The data from the first input generator 741 are also forwarded to the image extractor 751 located within the image comparator 750.

The first command module 731, located within the bonder command module 730 and coupled to the retriever 720, instructs the bonder to place a bond intended for the bond pad center according to the pre-program loaded into the bonder. Executing this instruction, the bonder, coupled to the first command module, attaches a first bond 760 to the sacrificial pad.

After first bond 760 has been completed, the vision system 740, associated with the bender, is activated again as the second input data generator 742. The input generator collects images of the actual bond attached to the sacrificial pad, including an image of the ball-shaped portion of the bond and an image of the wire portion of the bond. The data from the second input generator 742 are forwarded to the image comparator 750, specifically to the image extractor 751.

A search model generator 775 selects a simplified search model, such as a circle, ellipse, polygon, or synthetic image, for the ball-shaped portion of the bond and for the wire portion of the bond, respectively. The search model generator 775 is coupled to the image comparator 750.

Image comparator 750, and specifically its entry part, the image extractor 751, is coupled to the vision system 740 associated with the bonder, both with the first and the second input data generators (designated 741 and 742, respectively, in FIG. 7). The computerized image extractor 751 processes the input information submitted by the first data generator 741 and the second data generator 742 in order to extract the image of the attached bond.

Using commercially available computer software programs, the extracted bond image is sequentially processed in several steps of the image comparator 750. The noise filter 752 removes noise from the extracted bond image. The contour generator 753 reduces the filtered bond image to contours only and thus outlines the geometrical shape of the bond portions having the ball-shaped bond and the wire bond, respectively. The contour refiner 754 refines the geometrical outlines to thin, narrowly defined contours. These contours are forwarded to the contour approximator 755.

Contour approximator 755 is coupled both to the contour refiner 754 and the search model generator 775. It approximates the contours of the ball-shaped bond portion by a simplified search model (for example, circle, ellipse, polygon, or synthetic image) supplied by generator 775 for best fit into the ball-shaped outline. An example is the circle in FIG. 4E. Similarly, the approximator 755 approximates the contours of the wire bond portion by a simplified search model (for example, rectangle) supplied by generator 775 for best fit into the ware portion outline.

The second coordinate extractor 756 is coupled to the contour approximator 755; it determines the coordinates of the center of the best-fit search model. These coordinates are forwarded to the corrector 766, where they are compared with the pad center coordinates supplied by the first coordinate extractor 746. Based on this comparison, corrector 766 creates information for new bonder instruction which comprises the corrected bond center coordinates. The information is forwarded to the command module 730 of the bonder.

Finally, the second command module 732, located within the bonder command module 730, inputs this new bonder instruction and computes a new command of the bonder such that a second, corrected bond 761 is placed in the center of another pad chosen as a pad-to-be-bonded. With this corrected bond 761, the goal of controlling the bond process quality by measuring wire bond features has been achieved.

OTHER EMBODIMENTS

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

As an example, the invention discloses a computer-implemented method for controlling mechanical action quality by inspecting and measuring the mechanical result achieved by an automated machine pre-programmed to perform mechanical action onto an action site of an object, the machine having an associated vision system, comprising the steps of:

obtaining a first image of the action site before mechanical action;

determining the coordinates of the center of the action site;

instructing the machine to perform the mechanical action to the center of the action site;

obtaining a second image of the action site after the mechanical action, this second image comprising an image of the result of the action;

determining the coordinates of the center of the result by computer processing of the first and second images;

comparing the coordinates of the action center and the site center, thereby creating information for quality control of the machine instruction and mechanical process; and controlling the mechanical process quality by inputting new machine instruction for correcting any identified differences between the center coordinates.

This method has a number of more detailed process steps. The step of computer processing the first and second images comprises the step or:

extracting the image of the result of the mechanical action;

filtering the extracted result image by removing noise;

reducing the filtered result image to contours only, thus outlining the geometrical shape of the result;

refining the geometrical outlines into thin, narrowly defined contours;

approximating the contours of the result image by a simplified search model selected for best fit into the result image outline; and determining the coordinates of the center of the search model.

I claim:

1. A computerized system for inspecting and measuring a ball-shaped wire bond formed by an automated bonder pre-programmed to attach connecting bonds onto bond pads of an integrated circuit, said bonder having an associated vision system, comprising:

a pre-generated device program file operable to store a master bond program used for said pre-programing;

a retriever, coupled to said device program file, operable to regenerate said master program and to relate said program to alignment coordinates;

a first input data generator, coupled to said vision system associated with said bonder, operable to generate a first image of said bond pad before bond attachment as input information for a first coordinate extractor determining the coordinates of the center of said bond pad;

a first bonder command module, coupled to said retriever, operable to instruct the bonder to place a bond having a ball-shaped portion intended for the pad center according to said pre-program;

a second input data generator, coupled to said vision system associated with said bonder, operable to generate a second image of the bond pad after bond attachment, said second image comprising an image of said ball-shaped portion of said bond and an image of the wire portion of said bond;

a search model generator operable to select a simplified search model for said ball-shaped portion and said wire portion of said bond, respectively;

an image comparator, coupled to said vision system associated with said bonder and to said search model generator, operable to determine the coordinates of the center of said ball-shaped portion of said bond;

a corrector, coupled to said image comparator and said first coordinate extractor, operable to compare said coordinates of said bond center and said pad center and to create information for new bonder instruction having corrected bond center coordinates; and a second bonder command module, coupled to said corrector, operable to input said new bonder instruction and to compute a new command of said bonder such that a second, corrected bond is placed in said center of another pad.

2. The system according to claim 1 wherein said ball-shaped bond portion is replaced by a wedge-shaped or a stitch-shaped bond portion.

3. The system according to claim 1 wherein said image comparator further has a computerized system comprising:

an image extractor, coupled to said first and second input data generators in said vision system, operable to extract the image of said attached bond;

a noise filter, coupled to said image extractor, operable to remove noise from said extracted bond image;

a contour generator, coupled to said noise filter, operable to reduce said filtered bond image to contours only and thus to outline the geometrical shape of said bond portions having said ball-shaped bond and said wire bond;

a contour refiner, coupled to said contour generator, operable to refine said geometrical outlines to thin, narrowly defined contours;

a contour approximator, coupled to said contour refiner and to said search model generator, operable to approximate said contours of said ball-shaped bond portion and said wire bond portion by a simplified search model, respectively, selected for best fit into said outlines, respectively; and a second coordinate extractor, operable to determine the coordinates of the center of said search models.

4. A computerized system for inspecting and measuring the mechanical result achieved by an automated machine pre-programmed to perform mechanical action onto an action site of an object, said machine having an associated vision System, comprising:

a pre-generated object program file operable to store a master action program used for said pre-programming;

a retriever, coupled to said object program file, operable to regenerate said master program and to relate said program to alignment coordinates;

a first input data generator, coupled to said vision system associated with said machine, operable to generate a first image of said action site before action as input information for a first coordinate extractor determining the coordinates of the center of said action site;

a first machine command module, coupled to said retriever, operable to instruct the machine to perform said mechanical action intended for the site center according to said pre-program;

a second input data generator, coupled to said vision system associated with said machine, operable to generate a second image of the action site after the mechanical action, said second image comprising an image of the result of said action;

a search model generator operable to select a simplified model for said action result;

an image comparator, coupled to said vision system associated with said machine and to said search model generator, operable to determine the coordinates of the center of said action result;

a corrector, coupled to said image comparator and said first coordinate extractor, operable to compare said coordinates of said action result and said action site and to create information for new machine instruction having corrected result center coordinates; and a second machine command module, coupled to said corrector, operable to input said new machine instruction and to compute a new command of said machine such that a second, corrected action is placed in said center of another site.

5. The system according to claim 4 wherein said image comparator further has a computerized system comprising:

an image extractor, coupled to said first and second input data generators in said vision system, operable to extract the image of said action result;

a noise filter, coupled to said image extractor, operable to remove noise from said extracted action result image;

a contour generator, coupled to said noise filter, operable to reduce said filtered action result image to contours only and thus to outline the geometrical shape of any portions of said action result;

a contour refiner, coupled to said contour generator, operable to refine said geometrical outlines to thin, narrowly defined contours; a contour approximator, coupled to said contour refiner and to said search model generator, operable to approximate said contours of said action result portion by a simplified search model selected for best fit into said outlines; and a second coordinate extractor, operable to determine the coordinates of the center of said search models.

* * * * *